(12) United States Patent
Hamada et al.

(10) Patent No.: US 10,958,027 B2
(45) Date of Patent: Mar. 23, 2021

(54) ELECTRICAL CONNECTION BOX

(71) Applicant: Sumitomo Wiring Systems, Ltd., Mie (JP)

(72) Inventors: Ryoma Hamada, Mie (JP); Akihiro Oda, Mie (JP); Masakazu Okumura, Mie (JP); Tatsuya Daidoji, Mie (JP); Noriko Okamoto, Mie (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 16/693,576

(22) Filed: Nov. 25, 2019

(65) Prior Publication Data
US 2020/0185870 A1   Jun. 11, 2020

(30) Foreign Application Priority Data

Dec. 7, 2018  (JP) .............................. JP2018-230276

(51) Int. Cl.
*H01R 33/06* (2006.01)
*H01R 12/58* (2011.01)
(Continued)

(52) U.S. Cl.
CPC ......... *H01R 33/06* (2013.01); *B60R 16/0238* (2013.01); *B60R 16/0239* (2013.01);
(Continued)

(58) Field of Classification Search
CPC .... H01R 43/16; H01R 12/716; H01R 12/718; H01R 13/02; H01R 12/55; H01R 13/10; H01R 9/2466; H01R 9/226; H01R 12/724; H01R 12/721; H01R 4/2425; H01R 43/205; H01R 13/518; H01R 12/00; H01R 13/112; H01R 13/113; H01R 33/06; H01R 12/58; H01R 33/88; H01R 13/50; H01R 13/04; H01R 2201/26; H01R 43/20; H01R 12/585; H01R 13/41; H05K 7/026; H05K 2201/10189; H05K 3/3447; H05K 2201/10303; H05K 2201/10446; H05K 2201/10757; H05K 2201/10871;
(Continued)

(56) References Cited

U.S. PATENT DOCUMENTS

| | | | | |
|---|---|---|---|---|
| 7,666,025 B2* | 2/2010 | Cheng | ................ | H01R 12/7088 439/485 |
| 8,932,085 B2* | 1/2015 | Fang | .................... | H01R 12/724 439/676 |
| 10,305,211 B2* | 5/2019 | Lu | .......................... | H01R 4/029 |

FOREIGN PATENT DOCUMENTS

JP    1997-283004 A    10/1997

* cited by examiner

*Primary Examiner* — Abdullah A Riyami
*Assistant Examiner* — Justin M Kratt
(74) *Attorney, Agent, or Firm* — Honigman LLP

(57) ABSTRACT

Provided is an electrical connection box according to which it is possible to suppress the occurrence of mistakes in a manufacturing process, and it is possible to reliably prevent the occurrence of faulty products. The electrical connection box to be used in a vehicle includes a terminal having an inner-fitting plate portion that is fit into and held in a slit of a holding member; and multiple substrate connection portions that protrude along a surface of the inner-fitting plate portion from one side edge of the inner-fitting plate portion. The terminal has a shape that is asymmetrical in a direction in which the multiple substrate connection portions are arranged side by side.

5 Claims, 9 Drawing Sheets

(51) Int. Cl.
*H01R 33/88* (2006.01)
*H01R 13/50* (2006.01)
*B60R 16/023* (2006.01)
*H01R 13/04* (2006.01)
H01R 43/20 (2006.01)
H02B 1/48 (2006.01)
H01R 13/41 (2006.01)
H01R 4/2425 (2018.01)
H05K 7/02 (2006.01)
H01R 12/72 (2011.01)
H01R 13/518 (2006.01)
H01R 13/11 (2006.01)
H01R 9/24 (2006.01)
H05K 7/00 (2006.01)
H01R 9/22 (2006.01)
H05K 3/34 (2006.01)
H01R 12/00 (2006.01)
H02G 3/16 (2006.01)

(52) U.S. Cl.
CPC .......... *H01R 12/58* (2013.01); *H01R 13/04* (2013.01); *H01R 13/50* (2013.01); *H01R 33/88* (2013.01); *H01R 4/2425* (2013.01); *H01R 9/226* (2013.01); *H01R 9/2466* (2013.01); *H01R 12/00* (2013.01); *H01R 12/585* (2013.01); *H01R 12/721* (2013.01); *H01R 12/724* (2013.01); *H01R 13/112* (2013.01); *H01R 13/113* (2013.01); *H01R 13/41* (2013.01); *H01R 13/518* (2013.01); *H01R 43/20* (2013.01); *H01R 43/205* (2013.01); *H01R 2201/26* (2013.01); *H02B 1/48* (2013.01); *H02G 3/16* (2013.01); *H05K 3/3447* (2013.01); *H05K 7/00* (2013.01); *H05K 7/026* (2013.01); *H05K 2201/10189* (2013.01); *H05K 2201/10303* (2013.01); *H05K 2201/10446* (2013.01); *H05K 2201/10757* (2013.01); *H05K 2201/10871* (2013.01)

(58) Field of Classification Search
CPC .. H05K 7/00; B60R 16/0238; B60R 16/0239; H02B 1/48
USPC .............. 439/76.2, 949, 79, 541.5, 82, 751
See application file for complete search history.

ELECTRICAL CONNECTION BOX

CROSS-REFERENCE TO RELATED APPLICATIONS

This application claims priority of Japanese Patent Application No. JP 2018-230276 filed on Dec. 7, 2018, the contents of which are incorporated herein.

TECHNICAL FIELD

The present disclosure relates to an electrical connection box to be used in a vehicle.

BACKGROUND

Conventionally, an electrical connection box into which fuses are inserted has been mounted in a vehicle.

JP H9-283004A discloses an electrical connection box including a box main body provided with: multiple fuse fitting portions into which fuses are to be fit; multiple fusible link fitting portions into which fusible links are to be fit; and a main fusible link fitting portion into which a main fusible link is to be fit, wherein the fuse fitting portions, the fusible link fitting portions, and the main fusible link fitting portion are sequentially arranged on one surface of the box main body.

JP H9-283004A is an example of related art.

On the other hand, multiple FL (fusible link) terminals for connecting fuses to a substrate are mounted in the above-described electrical connection box. The FL terminals each have one end portion inserted into a fuse and another end portion soldered to the substrate. Also, the fuses each have two insertion holes. That is, two FL terminals forming a pair need to be provided so that the end portions on one side of the pair of FL terminals can be appropriately inserted into the insertion holes of a fuse.

Accordingly, if there is a mistake in the assembly of the FL terminals in the process of manufacturing the electrical connection box, a problem such as no longer being able to insert the FL terminals into the fuse will occur. However, this kind of problem cannot be resolved by the electrical connection box disclosed in JP H9-283004A.

The present disclosure was achieved in view of the foregoing circumstances, and it is an object thereof to provide an electrical connection box according to which it is possible to easily find assembly mistakes in the manufacturing process, and according to which it is possible to improve work efficiency in the manufacturing process.

SUMMARY

An electrical connection box according to one aspect of the present disclosure is an electrical connection box for a vehicle, including a terminal having: an inner-fitting plate portion that is fit into and held in a slit of a holding member; and a plurality of pin portions that protrude along a surface of the inner-fitting plate portion from one edge of the inner-fitting plate portion. The terminal has a shape that is asymmetrical in a direction in which the plurality of pin portions are arranged side by side.

Advantageous Effects of Disclosure

According to one aspect of the present disclosure, it is possible to easily find assembly mistakes in the manufacturing process, and it is possible to improve work efficiency in the manufacturing process.

DETAILED DESCRIPTION OF PREFERRED EMBODIMENTS

Figure 1:
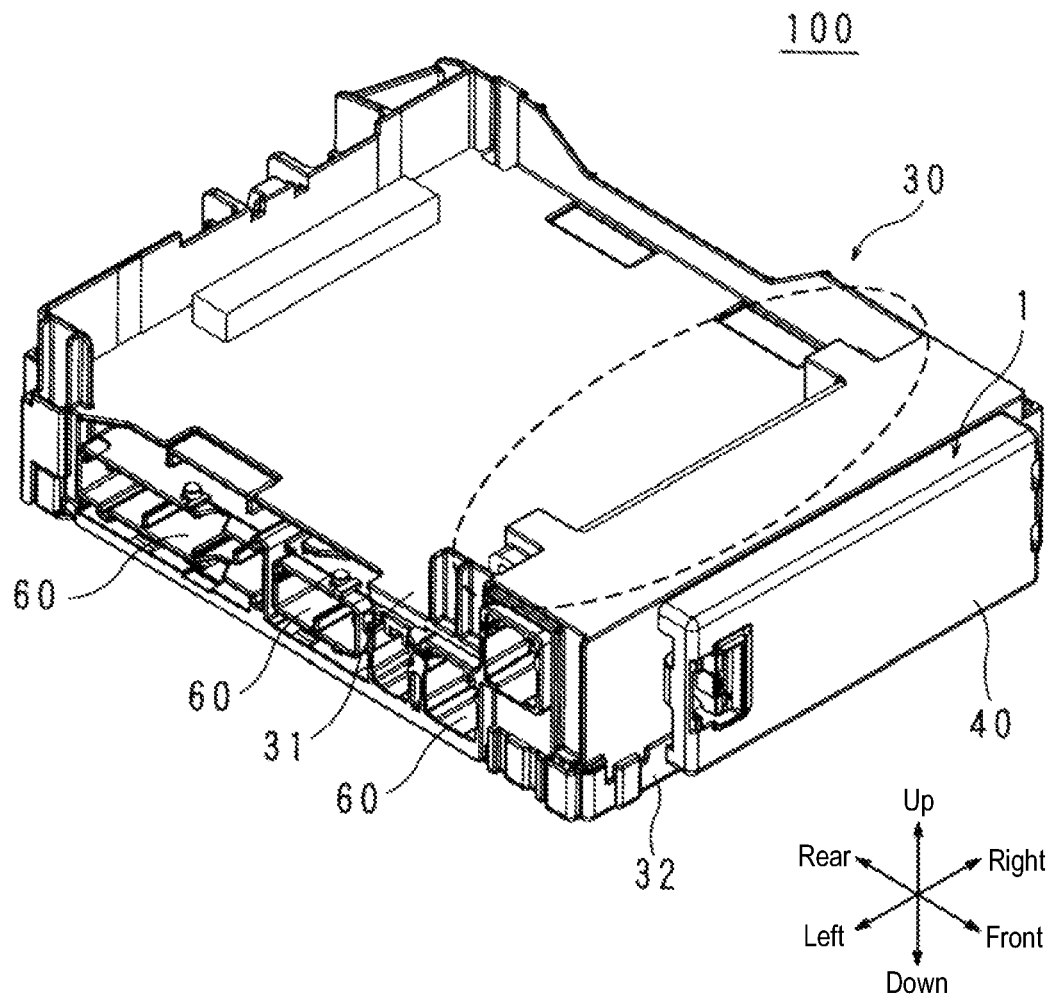
FIG. 1 is a perspective view showing the appearance of an electrical connection box according to the present embodiment.

First, embodiments of the present disclosure will be described in order. At least parts of the embodiments described hereinafter may be combined as needed.

An electrical connection box according to an aspect of the present disclosure is an electrical connection box for a vehicle, including a terminal having: an inner-fitting plate portion that is fit into and held in a slit of a holding member; and a plurality of pin portions that protrude along a surface of the inner-fitting plate portion from one edge of the inner-fitting plate portion. The terminal has a shape that is asymmetrical in a direction in which the plurality of pin portions are arranged side by side.

In this aspect, the terminal, which includes an inner-fitting plate portion that is fit into and held in a slit of the holding member and multiple pin portions that protrude along a surface of the inner-fitting plate portion from one side edge of the inner-fitting plate portion, has two sides that are asymmetrical with respect to the center in the direction in which the multiple pin portions are arranged side by side.

Accordingly, a worker performing assembly can quickly recognize a mistake in the direction of the terminal or the like, and the work efficiency in the manufacturing step can be improved.

In an electrical connection box according to an aspect of the present disclosure, the inner-fitting plate portion is rectangular, on both edges adjacent to the one edge of the inner-fitting plate portion, protruding portions are respectively provided toward another edge opposing the one edge, the protruding portions have different dimensions in the direction in which the one side edge and the other side edge oppose each other, and the holding member is provided with engagement portions that engage with the protruding portions inside of the slit.

In this aspect, the terminal is provided with mutually different protruding portions on both side edges in the direction in which the multiple pin portions are arranged side by side, and engagement portions that engage with the protruding portions are formed inside of the slit. Accordingly, when assembly is performed, if a worker makes a mistake regarding the direction of the terminal, the terminal can no longer be inserted into the slit. At this time, the worker can quickly recognize that the direction of the terminal is not correct. Accordingly, the work efficiency in the manufacturing process can be improved.

In an electrical connection box according to an aspect of the present disclosure, there are two of the pin portions, one of the two pin portions is provided toward an end portion of the inner-fitting portion in the direction in which the plurality of pin portions are arranged side by side, the other of the two pin portions is provided toward the center of the inner-fitting plate portion in the direction in which the plurality of pin portions are arranged side by side, and the electrical connection box includes a substrate having through holes through which protruding ends of the pin portions are inserted.

In this aspect, the positions of the two pin portions with respect to the center of the terminal are asymmetrical in the direction in which the two pin portions are arranged side by side, and the through holes are formed corresponding to the protruding ends of the pin portions in the substrate.

Accordingly, when assembly is performed, if a worker has made a mistake regarding the direction of the terminal, the protruding end of the terminal can no longer be inserted into the through hole of the substrate. At this time, the worker can quickly recognize that the direction of the terminal is not correct. Accordingly, the work efficiency in the manufacturing process can be improved.

In an electrical connection box according to an aspect of the present disclosure, the inner-fitting plate portion includes a plate portion that protrudes along a surface of the inner-fitting plate portion from the other edge of the inner-fitting plate portion, and a surface of the plate portion is provided with a recess or a protrusion.

In the present aspect, a recess or a protrusion is formed on a surface of the plate portion. Level differences occur due to the recesses or the protrusions, and the maximum dimension between the two surfaces of the plate portion becomes greater than the actual thickness of the plate portion. Accordingly, it is possible to reliably perform connection with a fuse having an insertion hole with a thickness greater than the actual thickness of the plate portion. Accordingly, it is possible to achieve a reduction of the weight of the electrical connection box and a reduction of the manufacturing cost.

In an electrical connection box according to an aspect of the present disclosure, two of the terminals are provided forming a pair such that the surfaces of the plate portions face each other.

In the present aspect, two of the terminals form a pair such that predetermined surfaces of the identical terminals face each other. Accordingly, it is possible to appropriately conform to the interval of the insertion holes of the fuse.

The present disclosure will be described specifically with reference to the drawings indicating the embodiment. The electrical connection box according to the embodiment of the present disclosure will be described hereinafter with reference to the drawings. Note that the present disclosure is not limited to these illustrative examples, but is defined by the claims. Meanings equivalent to the claims and all modifications within the claims are intended to be included.

Figure 2:
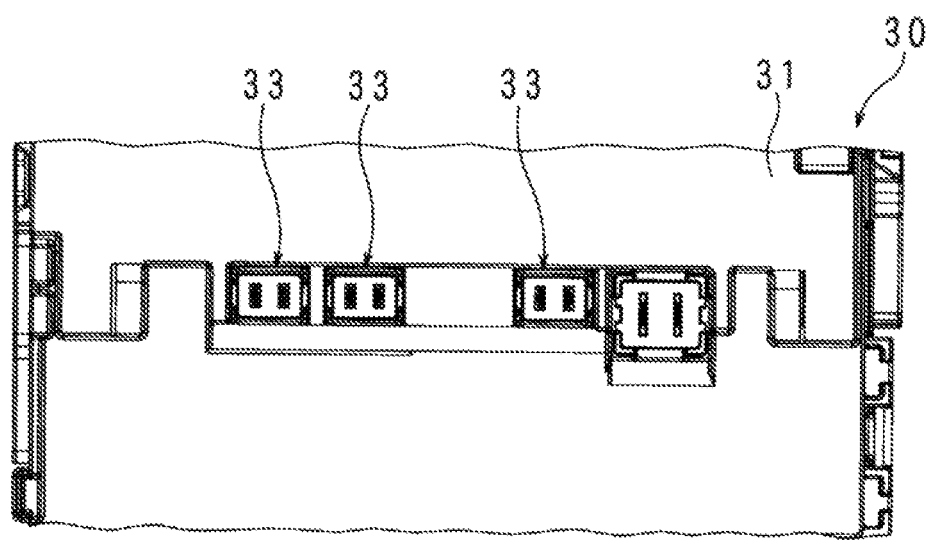
FIG. 2 is an enlarged view of a portion surrounded by a broken line in FIG. 1.

FIG. 1 is a perspective view showing the appearance of an electrical connection box 100 according to the present embodiment, and FIG. 2 is an enlarged view of a portion surrounded by a broken line in FIG. 1.

The electrical connection box 100 is a so-called fuse box into which fuses are inserted, and is mounted in a vehicle.

The electrical connection box 100 includes: a case member 30 that stores a substrate on which electrical components or the like are mounted; a fuse module 1 into which fuses are inserted; and a lid member 40 that covers an open port of the fuse module 1.

In the present embodiment, for the sake of convenience, "front", "rear", "left", "right", "up", and "down" of the electrical connection box 100 are defined according to the front-rear, left-right, and up-down directions shown in FIGS. 1 and 2. Hereinafter, description will be given using the thus-defined front-rear, left-right, and up-down directions.

The case member 30 includes: an upper case portion 31 and a lower case portion 32, and the front-side end portion of the upper case portion 31 covers the fuse module 1. The upper case portion 31 has a level difference, and the dimension of the front-side end portion is greater than that of the other portion in the up-down direction. In the upper case portion 31, multiple insertion ports 33 into which first fuses (not shown) are to be inserted are formed in the other portion excluding the front-side end portion. The first fuses are connected to the substrate via later-described FL terminals 14 (see FIG. 4). Also, the electrical connection box 100 is provided with multiple connector terminals 60 on the left and right side surfaces.

Figure 3:
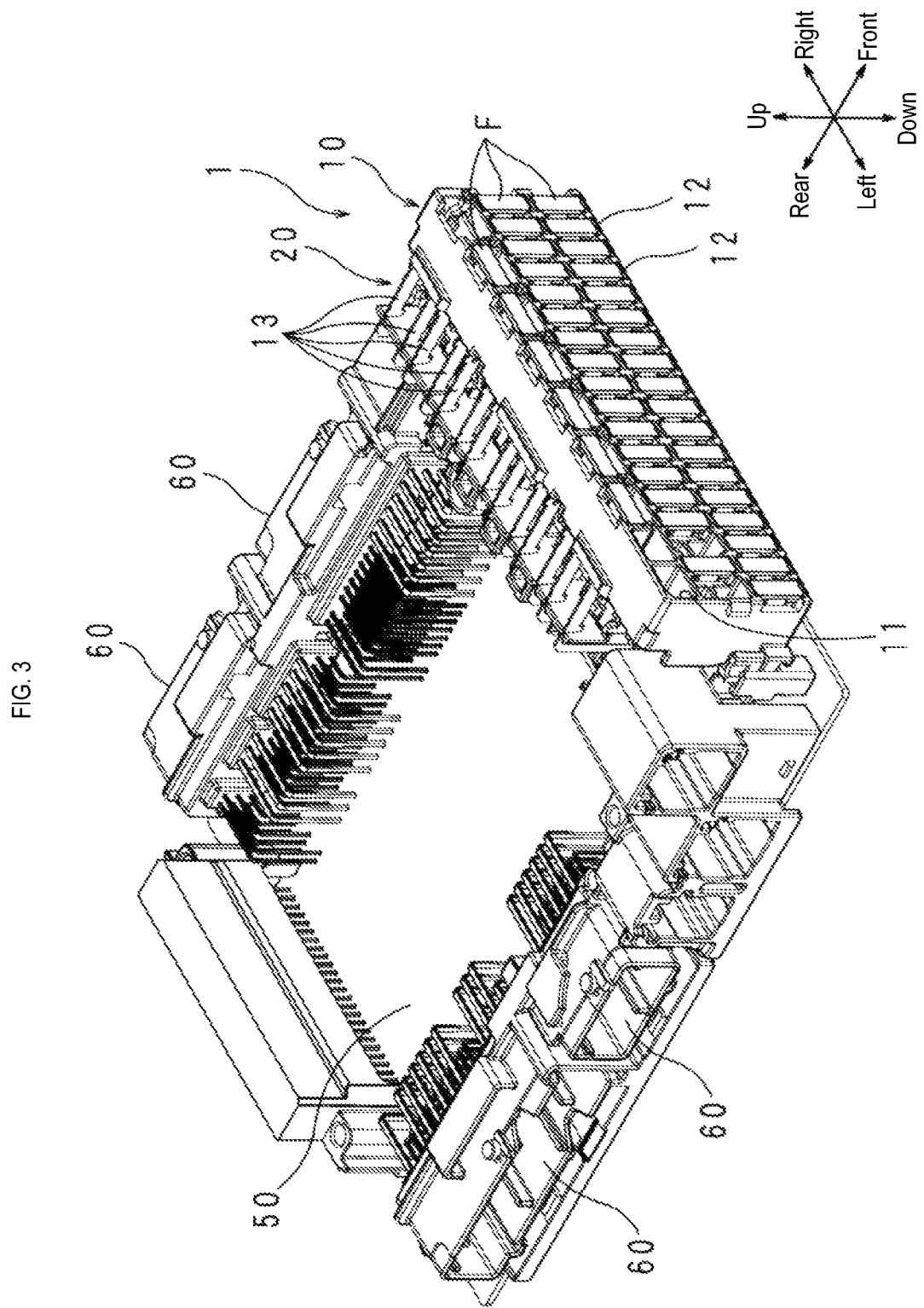
FIG. 3 is a perspective view showing a state in which a case member and a lid member have been omitted in the electrical connection box according to the present embodiment.

FIG. 3 is a perspective view showing the electrical connection box 100 according to the present embodiment, with the case member 30 and the lid member 40 omitted.

The fuse module 1 includes: an insertion housing 10 into which multiple second fuses F are inserted; multiple fuse terminals 13 that connect the second fuses F inserted into the insertion housing 10 and the substrate; and a holding member 20 that is a structural member for holding the fuse terminals 13.

The first fuses and the second fuses F are different types of fuses. For example, the first fuses and the second fuses F have different allowed currents, and differ in the amount of time it takes to melt and cut off the circuit.

The insertion housing 10 has a cuboid box shape in which the entire surface on the front side is open. Rectangular insertion holes 12 into which the second fuses F are inserted are provided in the form of a matrix inside of the insertion housing 10. That is, the insertion holes 12 are exposed via an open port 11 on the front side of the insertion housing 10.

The substrate 50 is arranged below the insertion housing 10. The substrate 50 is arranged spaced apart from the lower surface of the insertion housing 10, parallel to the lower surface. The second fuses F inserted into the insertion holes 12 are connected to the substrate 50 by the fuse terminals 13.

The open port 11 is rectangular, the multiple insertion holes 12 are arranged side by side in the lengthwise direction (left-right direction) of the open port 11 to form a row, and for example, three rows of insertion holes 12 are formed in the short direction (up-down direction) of the open port 11.

In the uppermost row that is farthest from the substrate 50, the lengthwise directions of the insertion holes 12 match the lengthwise direction of the open port 11, and in the other rows, the lengthwise directions of the insertion holes 12 intersect the lengthwise direction of the open port 11. That is, in the other rows, the lengthwise directions of the insertion holes 12 match the shorter direction of the open port 11.

Figure 4:
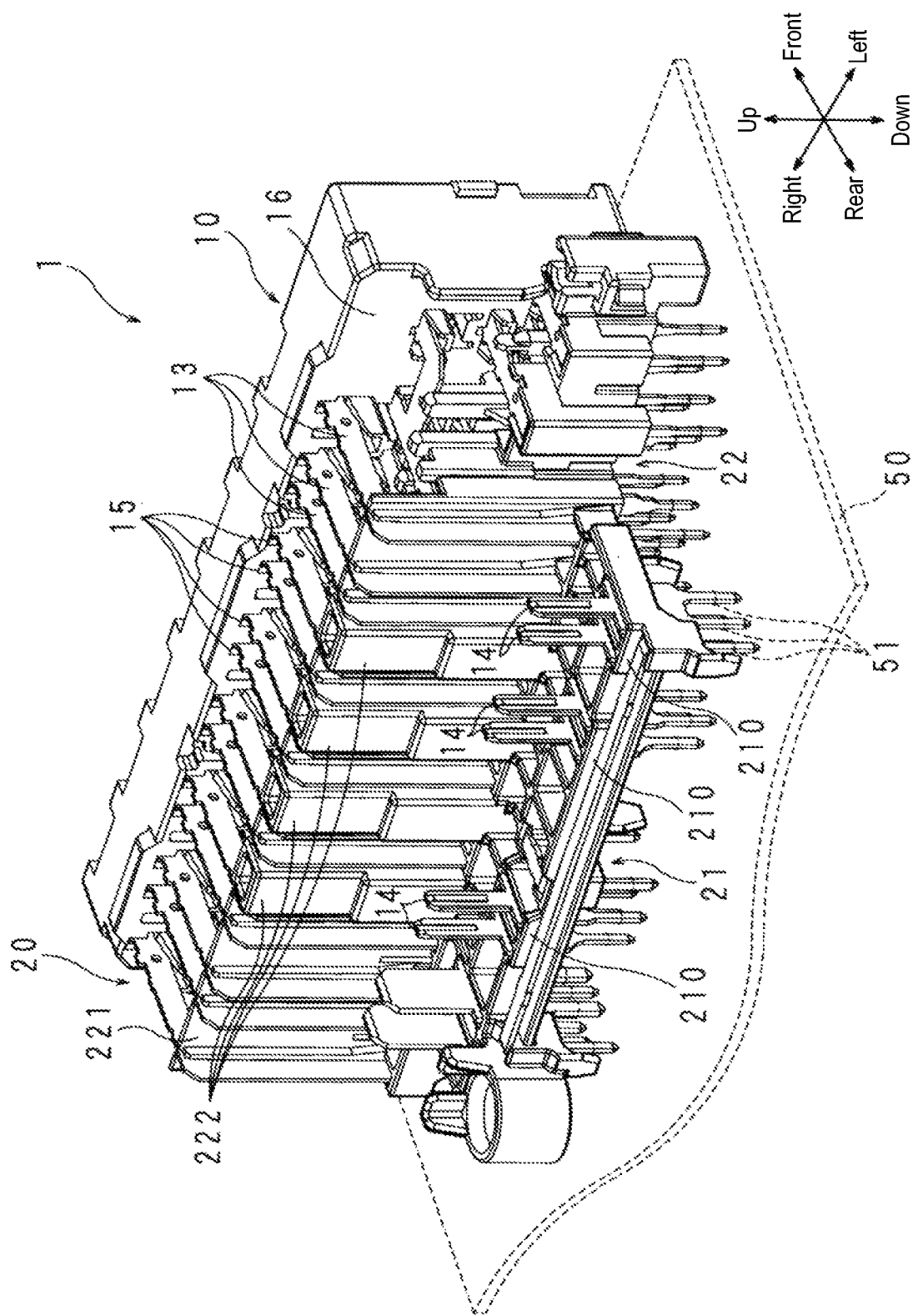
FIG. 4 is a perspective view showing a rear side of a fuse module of the electrical connection box according to the present embodiment.

FIG. 4 is a perspective view showing the rear side of the fuse module 1 of the electrical connection box 100 according to the present embodiment. In FIG. 4, for the sake of convenience in the description, the substrate 50 is indicated by a broken line.

Multiple through holes 15 into which the fuse terminals 13 are to be inserted are formed in the rear surface 16 of the insertion housing 10. For example, two through holes 15 are formed per insertion hole 12 (second fuse F).

The fuse terminals 13 are composed of thin plate materials made of a conductive metal. The fuse terminals 13 have bent portions at intermediate locations, and for example, are L-shaped. The end portions on one side of the fuse terminals 13 are inserted into the through holes 15 of the rear surface 16, and are connected to the second fuses F inserted into the insertion housing 10. The end portions on the other side of the fuse terminals 13 are bent downward, that is, toward the substrate 50, are inserted into through holes 51 of the substrate 50 (see FIG. 9), and are connected to the substrate 50 through soldering, for example.

The fuse terminals 13 inserted into the insertion holes 12 in the uppermost row (hereinafter referred to as the fuse terminals 13 in the uppermost row) are provided such that both main surfaces, which have large surface areas, face leftward or rightward. In other words, in each fuse terminal 13 of the uppermost row, the thickness direction of a portion on one side with respect to the bent portion and the thickness direction of a portion on another side with respect to the bent portion are parallel.

On the other hand, the fuse terminals 13 inserted into the insertion holes 12 in the other rows (hereinafter referred to as the fuse terminals 13 of the other rows) are provided such that the side surfaces adjacent to the main surfaces face leftward or rightward. In other words, in each fuse terminal 13 of the other rows, the thickness direction of the portion on one side with respect to the bent portion and the thickness direction of the portion on the other side with respect to the bent portion intersect.

Note that the rear surface 16 of the insertion housing 10 is rectangular and the fuse terminals 13 of the uppermost row are arranged side by side in the lengthwise direction of the rear surface 16.

The holding member 20 is composed of insulating plastic or the like and is arranged opposing the rear surface 16 of the insertion housing 10. The holding member 20 includes: a front portion 22 located toward the insertion housing 10; and a rear portion 21 located rearward with respect to the front portion 22.

The front portion 22 is a frame member having multiple holes formed in the up-down and left-right directions. Also, the front portion 22 includes a holding plate 221 that holds the fuse terminals 13 of the uppermost row. The holding plate 221 is provided with multiple notches in its upper edge portion, and the fuse terminals 13 of the uppermost row are held due to the notches engaging with the fuse terminals 13 of the uppermost row.

The rear surface of the holding plate 221 is provided with gripping portions 222 that are used for gripping the fuse module 1. The gripping portions 222 are provided between the fuse terminals 13 of the uppermost row, have quadrangular tube shapes, and extend in the up-down direction. The gripping portions 222 are provided at four locations in the center of the holding member 20 in the direction in which the fuse terminals 13 of the uppermost row are arranged side by side, that is, in the lengthwise direction of the rear surface 16 of the insertion housing 10. The present embodiment is not limited thereto, and the gripping portions 222 may also be provided at three or fewer locations, or at five or more locations.

The rear portion 21 is a grid-like frame member. The rear portion 21 includes multiple inner-fitting holding portions 210 that hold the FL terminals 14 for connecting the first fuses and the substrate 50. The multiple inner-fitting holding portions 210 are each configured such that two slits 211 (see FIG. 6) form a pair. The inner-fitting holding portions 210 hold the FL terminals 14 such that the FL terminals 14 extend in a direction intersecting the substrate 50, that is, in the lengthwise direction of the gripping portions 222.

Figure 5:
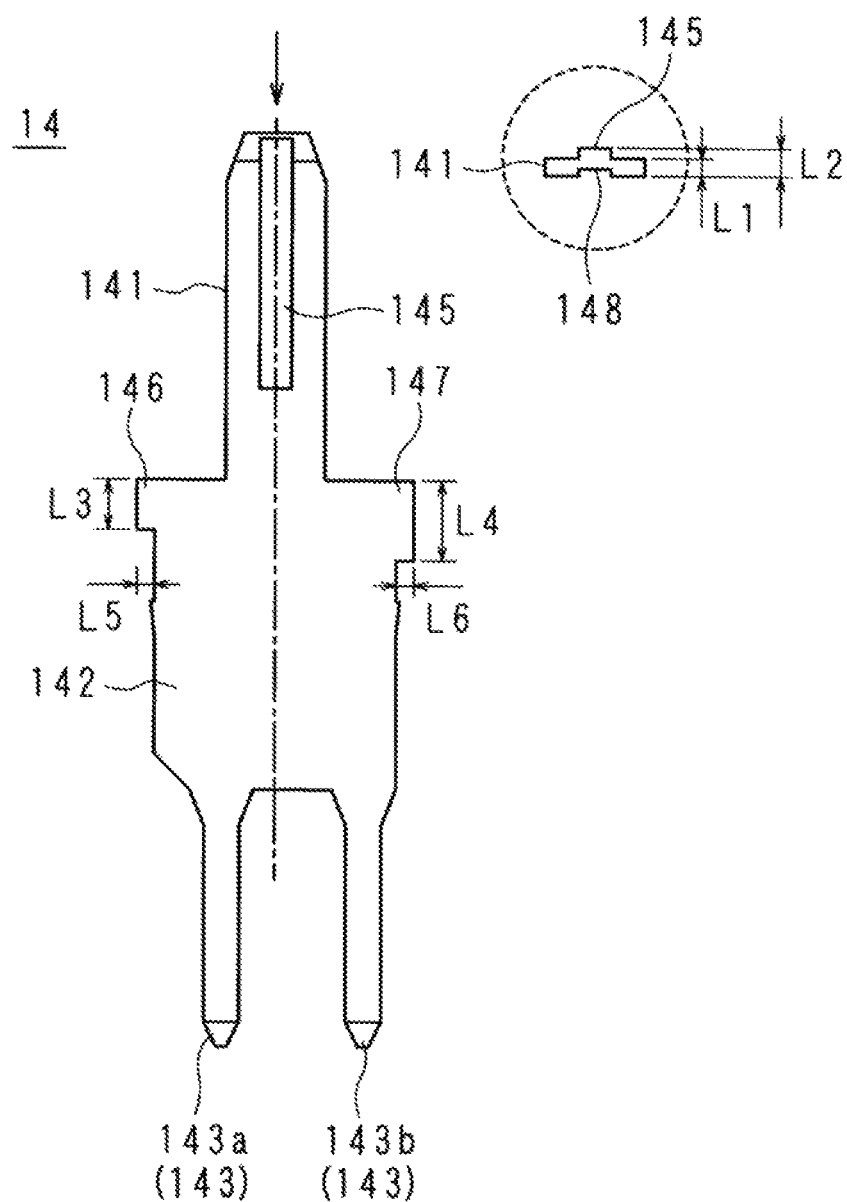
FIG. 5 is a front view of an FL terminal of the electrical connection box according to the present embodiment.

FIG. 5 is a front view of an FL terminal 14 of the electrical connection box 100 according to the present embodiment. The FL terminal 14 is composed of a thin plate material made of a conductive metal. The FL terminal 14 includes: a plate portion 141 that is inserted into a first fuse; an inner-fitting plate portion 142 that is fit into and held in an inner-fitting holding portion 210 of the rear-side portion 21; and substrate connection portions 143 (pin portions) that are to be connected to the substrate 50. In FIG. 5, the portion of the broken-line circle indicates a case in which the plate portion 141 is viewed in the direction of the arrow in FIG. 5.

The inner-fitting plate portion 142 has an approximately rectangular plate shape. For example, the plate portion 141 is extended in a direction along the surface of the inner-fitting plate portion 142 from an edge on one end side (upper side) in the lengthwise direction of the inner-fitting plate portion 142, and the substrate connection portions 143 are extended in a direction along the surface of the inner-fitting plate portion 142 from an edge on the other end side (lower side). The plate portion 141 is strip-shaped, and is provided at the approximate center of the edge (other edge) on the one end side of the inner-fitting plate portion 142. The substrate connection portions 143 are pin-shaped, and multiple substrate connection portions 143 are provided protruding from the edge (one edge) on the other end side of the inner-fitting plate portion 142. That is, the multiple substrate connection portions 143 are arranged side by side along the edge on the other end side. Hereinafter, a case in which there are two substrate connection portions 143 will be described as an example, but there is no limitation to this, and there may be three or more substrate connection portions 143 as needed.

This FL terminal 14 is configured to have an asymmetrical shape in the direction in which the multiple substrate connection portions 143 are arranged side by side. Hereinafter, specific description will be given.

On both edges adjacent to the edge on the one end side, the inner-fitting plate portion 142 is provided with mutually different protruding portions 146 and 147 at end portions toward the edge on the one end side. That is, on the one end side of the two edges in the shorter direction of the inner-fitting plate portion 142, the protruding portions 146 and 147 are provided extending along the surface of the inner-fitting plate portion 142.

The protruding portions 146 and 147 have mutually different dimensions in the direction in which the edge on the one end side and the edge on the other end side of the inner-fitting plate portion 142 oppose each other, that is, in the lengthwise direction of the inner-fitting plate portion 142. The protruding portion 146 has a rectangular shape in which the dimension in the lengthwise direction of the inner-fitting plate portion 142 is L3 and the dimension in the shorter direction of the inner-fitting plate portion 142 is L5. The protruding portion 147 has a rectangular shape in which the dimension in the lengthwise direction of the inner-fitting plate portion 142 is L4 and the dimension in the shorter direction of the inner-fitting plate portion 142 is L6.

Here, L3 is smaller than L4, and L5 and L6 are equal. Thus, the FL terminal 14 has a shape that is asymmetrical in the direction in which the two substrate connection portions 143 are arranged side by side, that is, in the shorter direction of the inner-fitting plate portion 142.

The electrical connection box 100 according to the present embodiment is not limited thereto, and L3 may be greater than L4, and either L5 or L6 may be greater than the other.

The substrate connection portions 143 are composed of substrate connection portions 143a and 143b, in which the protruding tips narrow, and the protruding tips are inserted into the through holes 51 of the substrate 50, and are connected to the substrate 50 through soldering, for example.

The substrate connection portion 143a is provided toward an end portion of the inner-fitting plate portion 142 in the direction in which the substrate connection portions 143 are arranged side by side. The substrate connection portion 143b is provided toward the center of the inner-fitting plate portion 142 in the direction in which the substrate connection portions 143 are arranged side by side. Accordingly, the FL terminal 14 has a shape that is asymmetrical in the direction in which the substrate connection portions 143 are arranged side by side.

In this manner, in the FL terminal 14, the two sides are asymmetrical with respect to the center (the one-dot chain line in FIG. 5) in the direction in which the two substrate connection portions 143 are arranged side by side. Accordingly, during the task of inserting the FL terminals 14 into the slits 211 of the inner-fitting holding portions 210, the worker can easily check visually whether the FL terminal 14 has been correctly inserted.

As described above, the plate portion 141 is approximately strip-shaped, a protrusion 145 is formed on one of two main surfaces with large surface areas, and a recess 148 is formed at a position corresponding to the protrusion 145 on the other main surface. There is no limitation to this, and the recess 148 may be formed on the one main surface of the plate portion 141 and the protrusion 145 may be formed on the other main surface of the plate portion 141.

The thickness of the plate portion 141 is essentially L1. Accordingly, if the width of the hole of the first fuse into which the plate portion 141 is to be inserted is greater than L1, or for example, is L2, the plate portion 141 (FL terminal 14) and the first fuse cannot be suitably connected.

However, in the FL terminal 14 of the electrical connection box 100 according to the present embodiment, the same effect as the thickness of the plate portion 141 being L2 is exhibited due to the plate portion 141 being provided with the protrusion 145 (recess 148). That is, even if the plate portion 141 has a thickness of L1, a level difference occurs due to the protrusion 145 (recess 148), and thus the maximum dimension between the two main surfaces of the plate portion 141 becomes L2. Accordingly, it is possible to reliably connect to a first fuse having a hole width of L2, which is greater than L1. Accordingly, it is possible to achieve a lighter weight of the electrical connection box 100 and a reduction of the manufacturing cost of the electrical connection box 100.

As described above, the inner-fitting holding portion 210 of the rear-side portion 21 is provided with two slits 211 forming a pair. In the electrical connection box 100 according to the present embodiment, the FL terminals 14 are inserted into the respective slits 211, and are held by pairs of slits 211 such that two FL terminals 14 form a pair.

Figure 6:
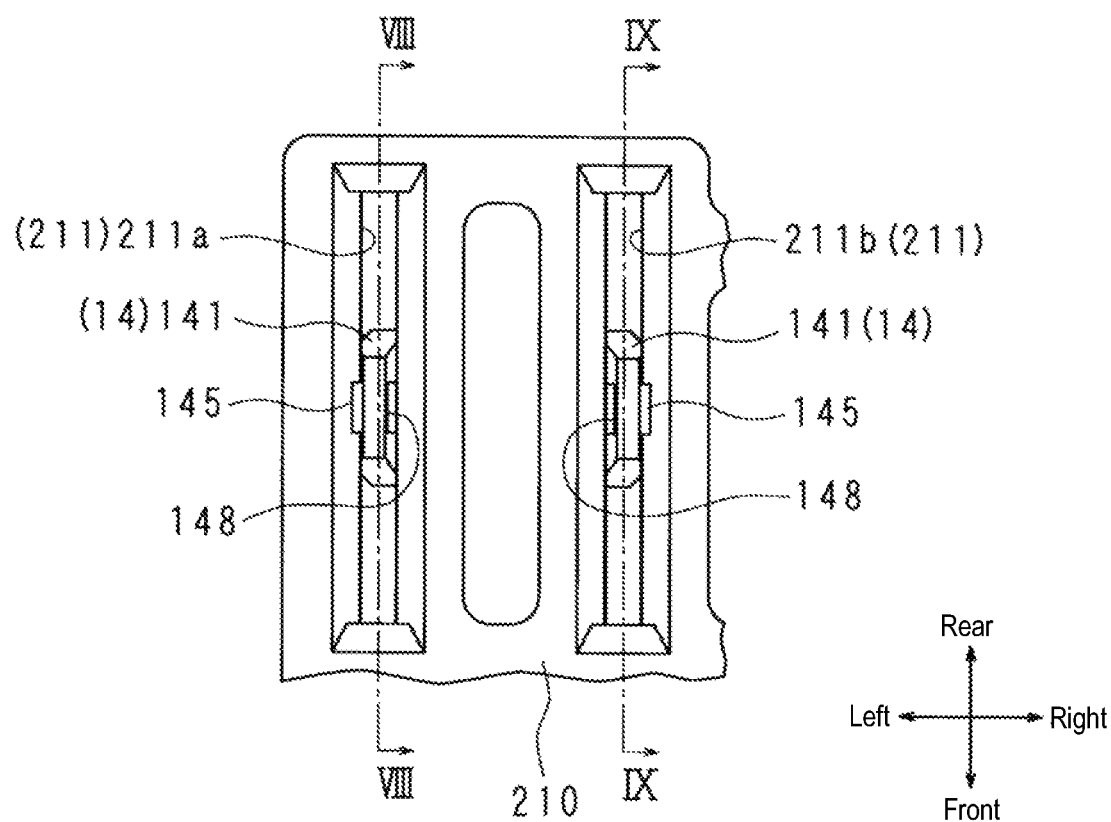
FIG. 6 is a diagram showing a state in which a pair of FL terminals are held by a pair of slits in the electrical connection box according to the present embodiment.

FIG. 6 is a diagram showing a state in which a pair of FL terminals 14 are held by a pair of slits 211 in the electrical connection box 100 according to the present embodiment.

The same FL terminals 14 are respectively inserted into the pair of slits 211. In the pair of slits 211, the FL terminal 14 held by the slit 211a on the left side of the drawing and the FL terminal 14 held by the slit 211b on the right side of the drawing are arranged such that identical surfaces thereof face each other. For example, as shown in FIG. 6, the main surface on which the recess 148 is formed in the FL terminal 14 held by the slit 211a and the main surface on which the recess 148 is formed in the FL terminal 14 held by the slit 211b face each other.

Figure 7:
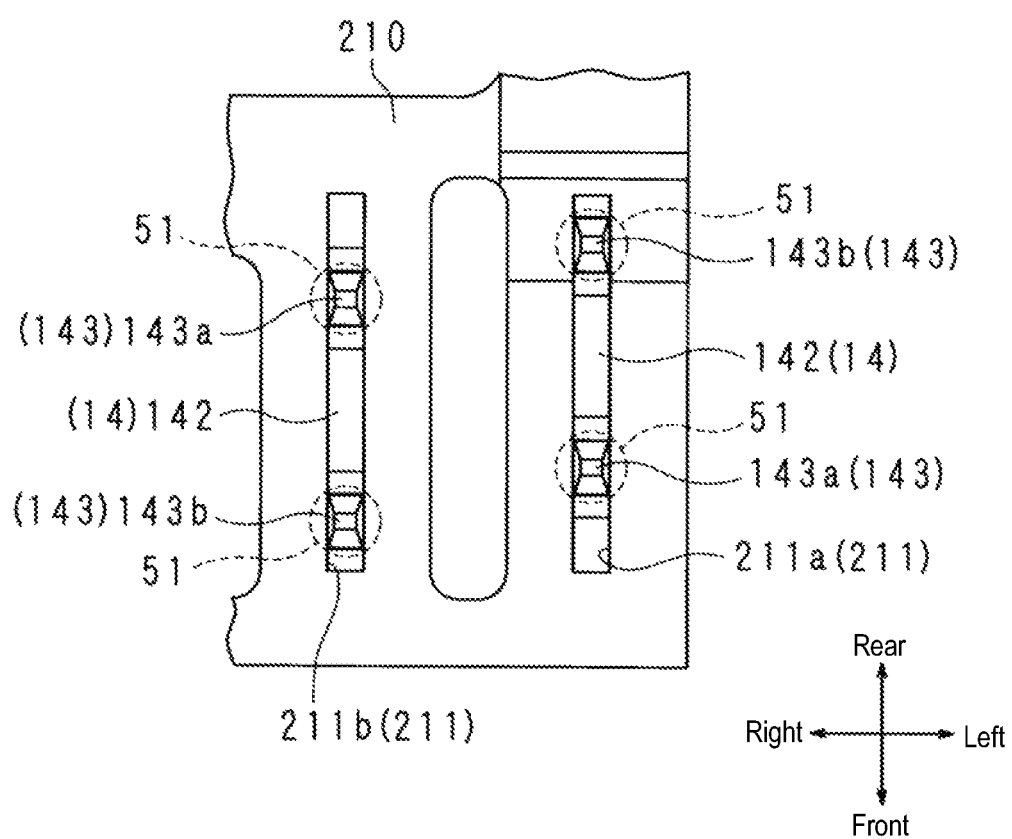
FIG. 7 is a diagram showing a positional relationship between substrate connection portions of the pair of FL terminals and a substrate in the electrical connection box according to the present embodiment.

FIG. 7 is a diagram showing a positional relationship between the substrate connection portions 143a and 143b of the pair of FL terminals 14 and the substrate 50 in the electrical connection box 100 according to the present embodiment. That is, FIG. 7 shows a case in which the pair of FL terminals 14 are viewed from below in a state in which the pair of FL terminals 14 are held by the pair of slits 211. Also, for the sake of convenience in the description, the through holes 51 of the substrate 50 are indicated by broken-line circles in FIG. 7.

In the electrical connection box 100 according to the present embodiment, the substrate connection portions 143a are provided toward the end portions of the inner-fitting plate portions 142 in the direction in which the substrate connection portions 143 are arranged side by side, the substrate connection portions 143b are provided toward the centers of the inner-fitting plate portions 142 in the direction in which the substrate connection portions 143 are arranged side by side, and the FL terminals 14 have shapes that are asymmetrical in the direction in which the substrate connection portions 143 are arranged side by side.

Furthermore, in the electrical connection box 100 according to the present embodiment, each pair of FL terminals 14 is arranged such that identical surfaces thereof face each other.

Accordingly, one FL terminal 14 and another FL terminal 14 in a pair of FL terminals have substrate connection portions 143a and 143b with different positions in the direction in which the substrate connection portions 143a and 143b are arranged side by side (the front-rear direction). Also, in the substrate 50, through holes 51 into which the protruding tips of the substrate connection portions 143a and 143b are inserted are formed at the positions corresponding to the substrate connection portions 143a and 143b of the one FL terminal 14 and the positions corresponding to the substrate connection portions 143a and 143b of the other FL terminal 14. The through holes 51 are formed in a staggered manner.

Due to having this kind of configuration, in the electrical connection box 100 according to the present embodiment, if the FL terminals are not suitably inserted into the slits 211, that is, if the FL terminals 14 are not inserted such that the main surfaces on which the recessed portions 148 are formed face each other, the protruding tips of the substrate connection portions 143a and 143b can no longer be inserted into the through holes 51 of the substrate 50. In this case, the FL terminals 14 that were unsuitably inserted protrude in the upward direction from the slits 211, and therefore are easily noticed by a worker. Accordingly, the work efficiency in the manufacturing process can be improved.

Figure 8:
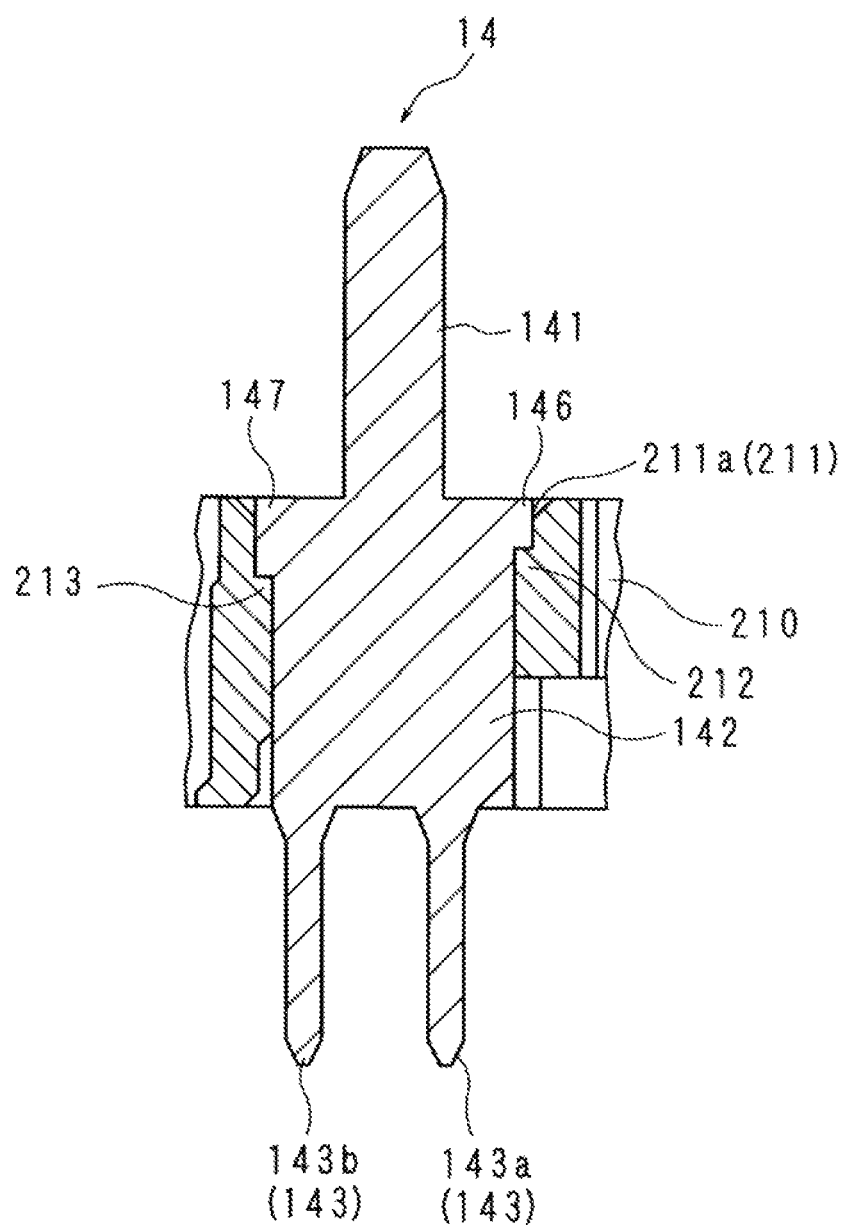
FIG. 8 is a cross-sectional view taken along line VIII-VIII in FIG. 6.
Figure 9:
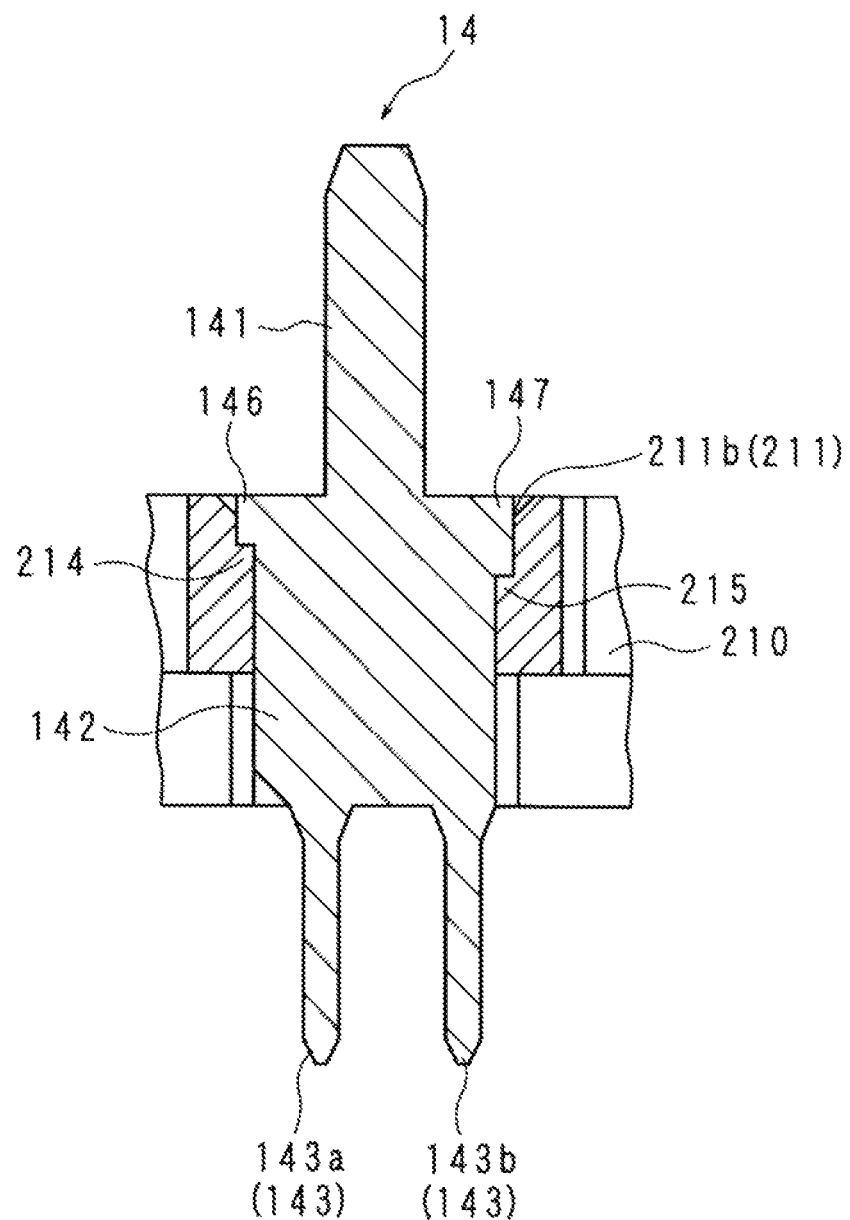
FIG. 9 is a cross-sectional view taken along line IX-IX in FIG. 6.

FIG. 8 is a cross-sectional view taken along line VIII-VIII in FIG. 6, and FIG. 9 is a cross-sectional view taken along line IX-IX in FIG. 6. That is, FIG. 8 shows the inside of a slit 211a, and FIG. 9 shows the inside of a slit 211b.

The pair of FL terminals 14 is fit into and held by the slits 211a and 211b. At this time, the inner-fitting plate portions 142 engage with the slits 211a and 211b. That is, engagement portions 212 and 213 for engaging with the protruding portions 146 and 147 of the inner-fitting plate portion 142 are provided inside of the slit 211a. Also, engagement portions 214 and 215 for engaging with the protruding portions 146 and 147 of the inner-fitting plate portion 142 are provided inside of the slit 211b. Specifically, the engagement portions 212 to 215 are level differences formed inside of the slits 211a and 211b, and are formed by changing the thicknesses of the slits 211a and 211b.

The engagement portions 212 and 214 are formed at positions that are separated by the length L3 downward from the upper ends of the slits 211a and 211b, and the thicknesses of the slits 211a and 211b are increased by L5 on the inside. The engagement portions 213 and 215 are formed at positions that are separated by the length L4 downward from the upper ends of the slits 211a and 211b, and the thicknesses of the slits 211a and 211b are increased by L6 on the inside.

If the FL terminals 14 are correctly inserted into the slits 211a and 211b, the engagement portions 212 and 214 engage with the protruding portions 146 of the inner-fitting plate portions 142 and the engagement portions 213 and 215 engage with the protruding portions 147 of the inner-fitting plate portions 142. In this case, the edges on the one end sides of the inner-fitting plate portions 142 are at approximately the same position as the upper ends of the slits 211a and 211b in the up-down direction.

On the other hand, if the FL terminals 14 have not been correctly inserted into the slits 211a and 211b, the protruding portions 147 of the inner-fitting plate portions 142 abut against the engagement portions 212 and 214, and the FL terminals 14 are not inserted any further. That is, the incorrect insertion of the FL terminals 14 is physically prevented.

In this case, the side edges on the one end sides of the inner-fitting plate portions 142 are located above the upper ends of the slits 211a and 211b in the up-down direction. Accordingly, the worker easily notices that the FL terminals 14 have not been correctly inserted. Accordingly, the work efficiency in the manufacturing process can be improved.

Due to having the above-described configuration, the electrical connection box 100 according to the present embodiment can reliably prevent mistakes that can occur when the FL terminals 14 are inserted into the slits 211a and 211b in the manufacturing process, and can improve the work efficiency in the manufacturing process.

Note that in the above description, the electrical connection box 100 according to the present embodiment has a configuration in which the mutually different protrusions 146 and 147 are provided on both ends of the edge on the one end side of the inner-fitting plate portion 142 in the direction in which the substrate connection portions 143a and 143b are arranged side by side. Furthermore, the substrate connection portion 143a is provided toward the end portion of the inner-fitting plate portion 142 in the direction in which the substrate connection portions 143a and 143b are arranged side by side, and the substrate connection portion 143b is provided toward the center of the inner-fitting plate portion 142.

However, the electrical connection box 100 according to the present embodiment is not limited thereto, and it is possible to include only one of the two above-described configurations.

The embodiment disclosed herein is illustrative in all respects, and is not to be construed as limiting. The scope of the present disclosure is defined not by the above-described meaning, but by the claims, and meanings equivalent to the claims and all modifications within the claims are intended to be included.

What is claimed is:

1. An electrical connection box for a vehicle comprising:
   a holding member having a slit;
   a terminal having an inner-fitting plate portion that is fit into and held in the slit of the holding member; and a plurality of pin portions that protrude along a surface of the inner-fitting plate portion from one edge of the inner-fitting plate portion; wherein the terminal has a shape that is asymmetrical in a direction in which the plurality of pin portions are arranged side by side; and
   on both edges adjacent to the one edge of the inner-fitting plate portion, protruding portions are respectively provided near another edge opposing the one edge,
   the protruding portions have different dimensions in the direction in which the one side edge and the other side edge oppose each other, and
   the holding member is provided with engagement portions that engage with the protruding portions inside of the slit.

2. The electrical connection box according to claim 1, wherein the inner-fitting plate portion is rectangular.

3. The electrical connection box according to claim 2, wherein
   the inner-fitting plate portion includes a plate portion that protrudes along a surface of the inner-fitting plate portion from the other edge of the inner-fitting plate portion, and
   a surface of the plate portion is provided with a recess or a protrusion.

4. The electrical connection box according to claim 3, wherein two of the terminals are provided forming a pair such that the surfaces of the plate portions face each other.

5. The electrical connection box according to claim 1, wherein
   there are two of the pin portions,
   one of the two pin portions is provided toward an end portion of the inner-fitting plate portion in the direction in which the plurality of pin portions are arranged side by side,
   the other of the two pin portions is provided toward the center of the inner-fitting plate portion in the direction in which the plurality of pin portions are arranged side by side, and
   the electrical connection box includes a substrate having through holes through which protruding ends of the pin portions are inserted.

* * * * *